United States Patent
Song

(10) Patent No.: US 7,119,590 B1
(45) Date of Patent: *Oct. 10, 2006

(54) SCALABLE INTEGRATED CIRCUIT ARCHITECTURE

(75) Inventor: Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/313,366

(22) Filed: Dec. 21, 2005

Related U.S. Application Data

(63) Continuation of application No. 10/795,039, filed on Mar. 5, 2004, now Pat. No. 6,998,888.

(51) Int. Cl.
*H03L 7/06* (2006.01)

(52) U.S. Cl. .................... 327/156; 327/147; 331/16

(58) Field of Classification Search .............. None
See application file for complete search history.

(56) References Cited

U.S. PATENT DOCUMENTS

| | | | |
|---|---|---|---|
| 4,494,021 A | 1/1985 | Bell et al. | 327/262 |
| 5,039,893 A | 8/1991 | Tomisawa | 327/276 |
| 5,374,904 A | 12/1994 | Ishibashi | 331/17 |
| 5,412,349 A | 5/1995 | Young et al. | 331/34 |
| 5,469,120 A | 11/1995 | Nguyen et al. | 331/177 R |
| 5,714,912 A | 2/1998 | Fiedler et al. | 331/57 |
| 5,821,823 A | 10/1998 | Bereza | 331/57 |
| 5,847,616 A | 12/1998 | Ng et al. | 331/57 |
| 5,864,249 A | 1/1999 | Shoji | 327/156 |
| 6,252,465 B1 | 6/2001 | Katoh | 327/25 |
| 6,259,293 B1 | 7/2001 | Hayase et al. | 327/276 |
| 6,353,648 B1 | 3/2002 | Suzuki | 327/376 |
| 6,492,851 B1 | 12/2002 | Watarai | 327/158 |
| 6,515,520 B1 | 2/2003 | Kiyose | 327/108 |
| 6,794,912 B1 * | 9/2004 | Hirata et al. | 327/158 |
| 6,794,949 B1 | 9/2004 | Bhagavatheeswaran et al. | 331/160 |

* cited by examiner

*Primary Examiner*—Tuan T. Lam

(57) ABSTRACT

An integrated circuit architecture comprises a phase lock loop (PLL) circuit that includes a feedback circuit that receives a reference signal. A voltage controlled oscillator (VCO) generates an output signal to an input of the feedback circuit. A master transistor has a control terminal, a first terminal, and a second terminal that communicates with the VCO. The feedback circuit compares the output signal of the VCO to the reference signal and outputs a drive signal to the control terminal of the master transistor based on the comparison. N slave transistors have control terminals that communicate with the control terminal of the master transistor, first terminals, and second terminals that communicate with respective ones of N circuits.

28 Claims, 5 Drawing Sheets

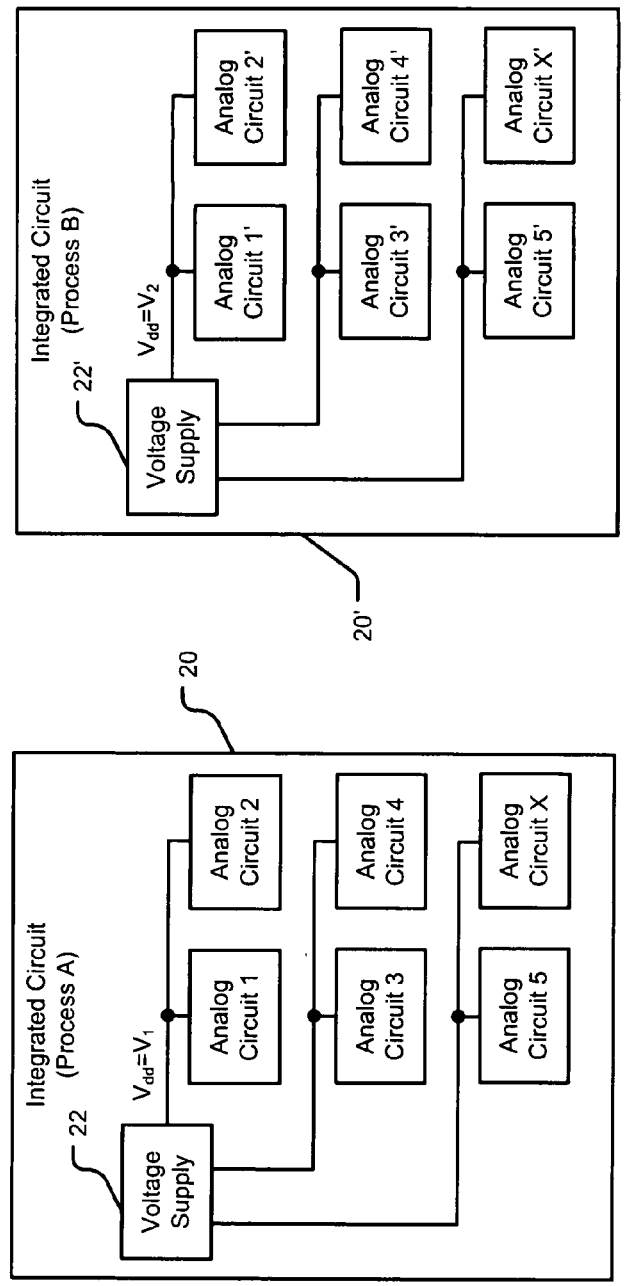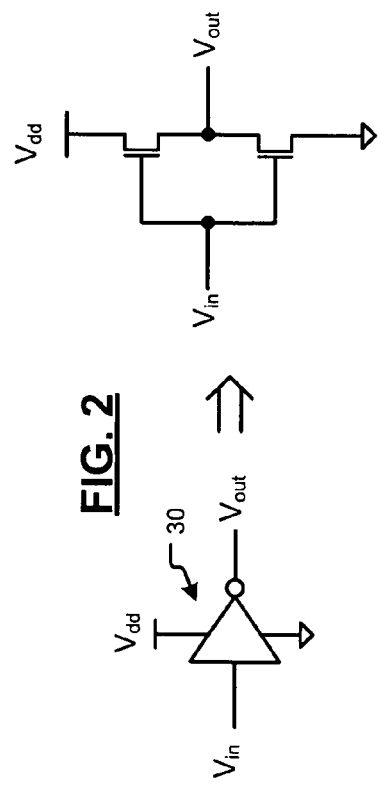

SCALABLE INTEGRATED CIRCUIT ARCHITECTURE

CROSS-REFERENCE TO RELATED APPLICATIONS

This application is a continuation of U.S. patent application Ser. No. 10/795,039 filed on Mar. 5, 2004 now U.S. Pat. No. 6,998,888. The disclosure of the above application is incorporated herein by reference in its entirety.

FIELD OF THE INVENTION

The present invention relates to integrated circuits, and more particularly to scalable integrated circuit architectures.

BACKGROUND OF THE INVENTION

Integrated circuits may be implemented using analog and/or digital circuits. To increase performance, the integrated circuits are typically made using a fabrication process having a minimum feature size for a target cost and speed. Using the minimum feature size generally reduces power consumption.

Different processes require different voltage supply levels to provide operation at a given clock frequency. For example, for a predetermined clock frequency, a 0.15μ process may require 1.5V, a 0.13μ process may require 1.2V, and a 0.09μ process may require 1.0V. In conventional integrated circuits, the individual analog circuits generally need to be redesigned when the process is changed. The redesign process adds additional cost and delay to the design process.

Referring now to FIGS. 1A and 1B, an integrated circuit 20 in FIG. 1A fabricated using Process A and includes analog circuits 1, 2, 3, 4, 5, . . . and X as shown. An integrated circuit 20' in FIG. 1B has the same functionality, is fabricated using Process B and includes analog circuits 1', 2', 3', 4', 5', . . . and X', which are redesigned versions of the corresponding circuits in FIG. 1A. Since Process A is faster than Process B, a power supply 22 in FIG. 1A generates $V_1$ will typically be less than $V_2$ (which is generated by power supply 22' in FIG. 1B) for a given clock frequency.

Referring now to FIG. 2, a first process is used to implement an inverter 30 that is commonly used in analog circuits. $V_{dd}$ is required to provide a predetermined switching speed, which refers to the time required for the output $V_{out}$ to transition when the input $V_{in}$ transitions. When a second process that is slower than the first process is used, $V_{dd}$ is increased to obtain the predetermined switching speed. When a third process that is faster than the first process is used, $V_{dd}$ is decreased to obtain the predetermined switching speed.

SUMMARY OF THE INVENTION

An integrated circuit architecture according to the present invention comprises a phase lock loop (PLL) circuit that includes a feedback circuit that receives a reference signal. A voltage controlled oscillator (VCO) has an output that communicates with an input of the feedback circuit. A master transistor has a control terminal, a first terminal, and a second terminal that communicates with the VCO. The feedback circuit compares the output of the VCO to the reference signal and generates a drive signal that is output to the control terminal of the master transistor. The integrated circuit architecture further includes N circuits and N slave transistors that have control terminals that communicate with the control terminal of the master transistor, first terminals, and second terminals that communicate with respective ones of the N circuits.

In other features, a voltage supply communicates with the first terminals of the master transistor and the N slave transistors. The feedback circuit includes a phase detector that detects a phase difference between the reference signal and the output of the VCO and that generates an error signal based on the difference. The feedback circuit includes a charge pump that receives the error signal from the phase detector. The feedback circuit includes a loop filter that has an input that communicates with the charge pump and an output that generates the drive signal.

In other features, at least one of the N circuits is one of an interpolator, a multiplexer, a clock buffer and a driver. The interpolator receives a clock output of the VCO. A scaling circuit has an input that communicates with the VCO and an output that communicates with the feedback circuit. The scaling circuit at least one of divides the output of the VCO by a first integer and multiplies the output of the VCO by a second integer. The master transistor and the N slave transistors are NMOS transistors, the first terminals are drains, the second terminals are sources, and the control terminals are gates. N is equal to 1 or is greater than 1. A filter network communicates with the control terminal of the master terminal and the control terminals of the N slave transistors.

An integrated circuit architecture includes a temperature-process tracking circuit that includes a master transistor with a control terminal, a first terminal and a second terminal. The temperature-process tracking circuit generates a drive signal that is output to the control terminal. The integrated circuit architecture includes N circuits and N slave transistors, which have control terminals that communicate with the control terminal of the master transistor, first terminals, and second terminals that communicate with respective ones of the N circuits.

In other features, the temperature-process tracking circuit further includes a feedback circuit that receives a reference signal and a voltage output circuit or a delay control circuit. The feedback circuit compares the output of the voltage output circuit or the delay control circuit to the reference signal and generates the drive signal. A voltage supply communicates with the first terminals of the master transistor and the N slave transistors.

In other features, the master transistor and the N slave transistors are NMOS transistors, the first terminals are drains, the second terminals are sources, and the control terminals are gates. N is equal to 1 or is greater than 1. A filter network communicates with the control terminal of the master terminal and the control terminals of the N slave transistors.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1A is a functional block diagram of an integrated circuit that includes multiple analog circuits and that is fabricated using Process A;

FIG. 1B is a functional block diagram of an integrated circuit that is similar to FIG. 1A, that includes multiple analog circuits that correspond to the analog circuits in FIG. 1A and that is fabricated using Process B;

FIG. 2 shows equivalent electrical schematics of an inverter;

DETAILED DESCRIPTION OF THE PREFERRED EMBODIMENTS

Figure 3:
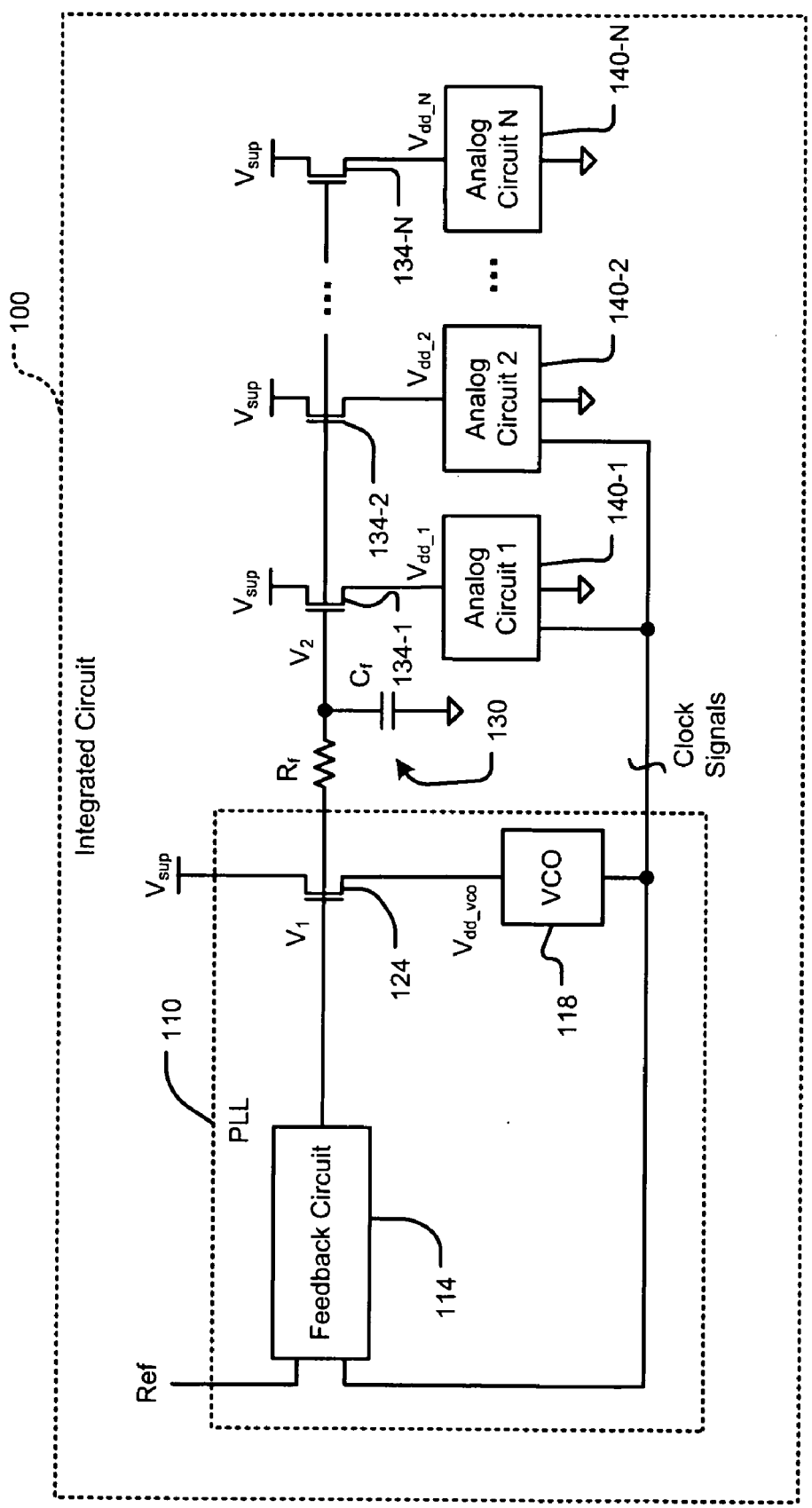
FIG. 3 is a functional block diagram and electrical schematic of one implementation of an integrated circuit architecture according to the present invention including a phase lock loop (PLL) and one or more analog circuits.

The following description of the preferred embodiment(s) is merely exemplary in nature and is in no way intended to limit the invention, its application, or uses. For purposes of clarity, the same reference numbers will be used in the drawings to identify the similar elements.

The integrated circuit (IC) architecture according to the present invention includes a phase lock loop (PLL) with an analog voltage controlled oscillator (VCO) and master and slave transistors. The PLL generates a drive signal for the master transistor using a closed loop approach. The drive signal adjusts a bias voltage output by the master transistor to the VCO to the proper bias voltage for a predetermined operating or clock frequency. The bias voltage compensates for the particular process that is used to fabricate the integrated circuit. The drive signal is mirrored to slave transistors that output bias voltages to respective analog circuits. The same approach can be used for other types of circuits such as temperature-process tracking circuits with voltage or delay locking loops.

Referring now to FIG. 3, a first integrated circuit 100 includes a PLL circuit 110, which includes a feedback circuit 114, a VCO 118 and a master transistor 124. The feedback circuit 114 receives a reference signal, which can be generated by a crystal oscillator or another circuit. The feedback circuit 114 compares the reference signal to an output of the VCO 118. The output of the VCO 118 may be divided by X and/or multiplied by Y where X and Y are integers. The feedback circuit 114 generates a transistor drive signal that is based on the comparison.

The master transistor 124 has a first terminal that is connected to a supply voltage. A control terminal of the master transistor 124 receives the drive signal from the feedback circuit 114. A second terminal of the master transistor 124 supplies the bias voltage to the VCO 118. The VCO 118 generates one or more clock signals for other circuits in the integrated circuit 100 as shown.

The control terminal of the master transistor 124 is connected through an optional filter 130 to a control terminal of a transistor 134-1, which has a first terminal that is referenced to a supply voltage $V_{sup}$. In one embodiment, the optional filter 130 includes a series resistance $R_f$ and a parallel capacitance $C_f$. A second terminal of the transistor 134-1 biases an analog circuit 140-1. The control terminal of the transistor 134-1 is connected to control terminals of other transistors 134-2, ..., 134-N that are associated with other analog circuits 140-2, ..., 140-N (collectively analog circuits 140), respectively, in the integrated circuit 100. In other words, the transistors 124 and 134 are connected in a source follower arrangement. First terminals of the transistors 134-2 and 134-3 (collectively transistors 134) are also referenced to the supply voltage $V_{sup}$. Second terminals of the transistors 134-1, 134-2, and 134-3 bias the analog circuits 140-1, 140-2, and 140-3, respectively.

The clock signal(s) that are generated by the VCO 118 of the PLL 110 are output to one or more of the analog circuits. Furthermore, one or more of the analog circuits 140-1, 140-2, ..., and 140-N can be connected to others of the analog circuits 140-1, 140-2, ..., and 140-N.

In operation, the feedback circuit 114 outputs the drive signal to the control terminal of the transistor 124 at a voltage $V_1$. The voltage $V_1$ is adjusted to produce the correct clock frequency. The transistor 124 supplies the correct bias voltage $V_{dd\_vco}$ to the VCO 118. The output of the VCO 118 will eventually settle to the predetermined clock frequency. Since the VCO 118 and master transistor 124 is fabricated using the same process as the other analog circuits, the drive voltage $V_1$ is also used to drive the transistors 134-1, 134-2, ..., and 134-N, which are associated with the analog circuits 140-1, 140-2, ..., and 140-N. Therefore, the VCO 118 compensates for the process variations.

The bias voltage $V_{dd\_vco}$ is equal to the drive voltage $V_1$ minus $V_{GS}$. The drive voltages $V_2$ of the transistors 134-1, 134-2, ..., and 134-N are also approximately equal to $V_1$. For example, the bias voltages $V_{dd1}$ of the transistor 134-1 will also be equal to the drive voltage $V_2$ minus $V_{GS1}$. The bias voltages for the individual analog circuits 140 can be adjusted relative to the main bias voltage and/or other analog circuits by adjusting the width of the transistors 134 relative to the transistor 124 since $$V_{GS} \propto \frac{1}{\sqrt{W}}$$

and $$\frac{W_{vco}}{W_1} \approx \frac{I_{vco}}{I_1}.$$

$I_{vco}$ is the current into the VCO 118, $I_1$ is the current into the analog circuit 140-1 and $W_{VCO}$ and $W_1$ are the widths of the master transistor 124 and the transistor 134-1, respectively. A similar relationship exists between the current and bias voltages of the other analog circuits 140-2, ..., and 140-N.

Figure 4:
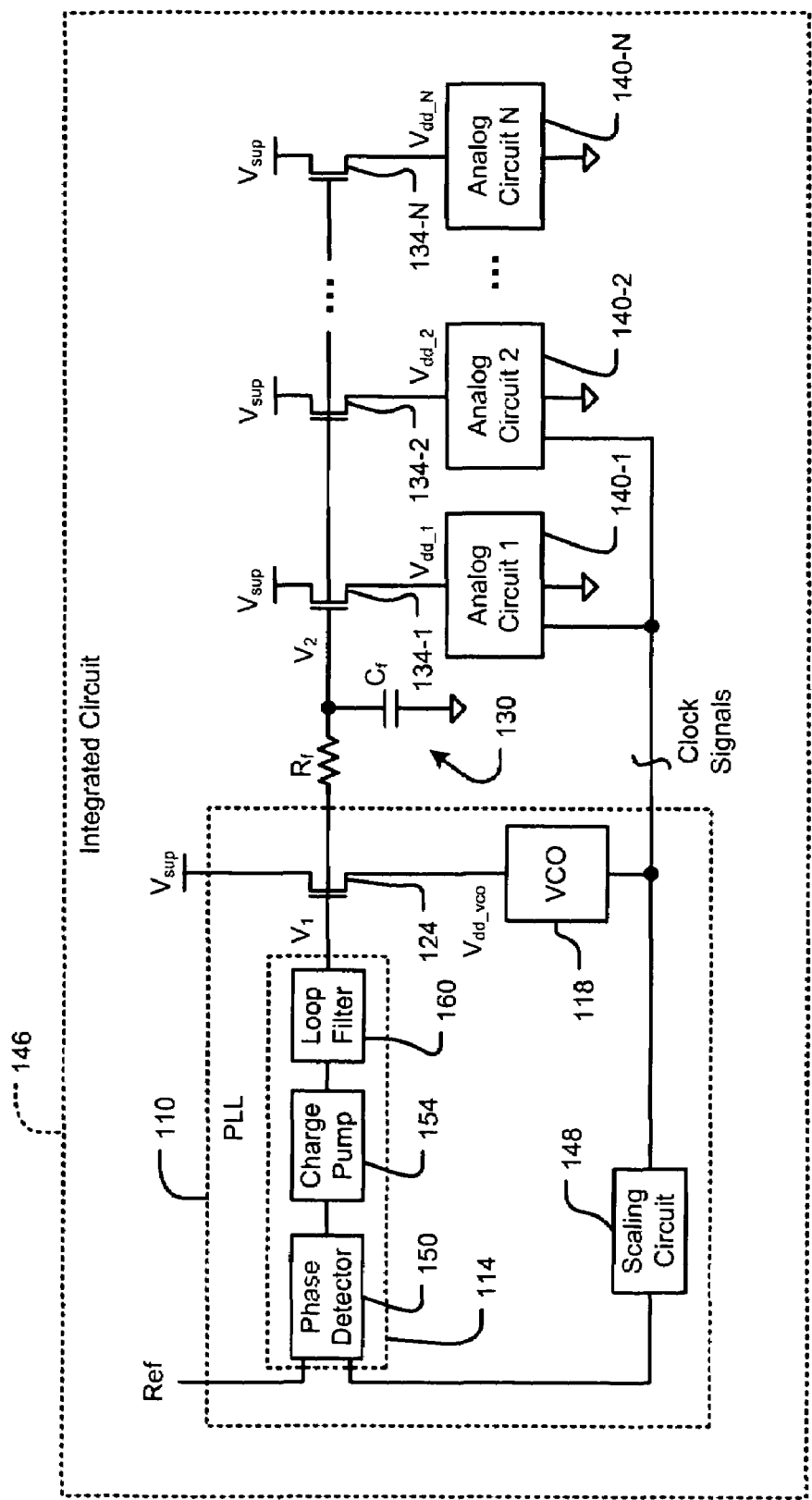
FIG. 4 is a functional block diagram and electrical schematic of another implementation of an integrated circuit architecture according to the present invention including a phase lock loop (PLL) and one or more analog circuits.

Referring now to FIG. 4, in a second integrated circuit 146, the output of the VCO 118 is input to scaling circuit 148. The scaling circuit 148 divides by a first integer X and/or multiples by a second integer Y. An output of the scaling circuit 148 is input to the feedback circuit 114. In this implementation, the feedback circuit 114 includes a phase detector 150, which detects a phase difference between the reference signal and the output of the scaling circuit 148 and generates a phase error signal that is output to a charge pump 154. The charge pump 154 generates an output voltage based on the error signal that is higher that the supply voltage. An output of the charge pump 154 is input to a loop filter 160, which filters the output of the charge pump 154. An output of the loop filter 160 drives the control terminal of the transistor 124 and the transistors 134-1, 134-2, . . . , and 134-N.

Figure 5:
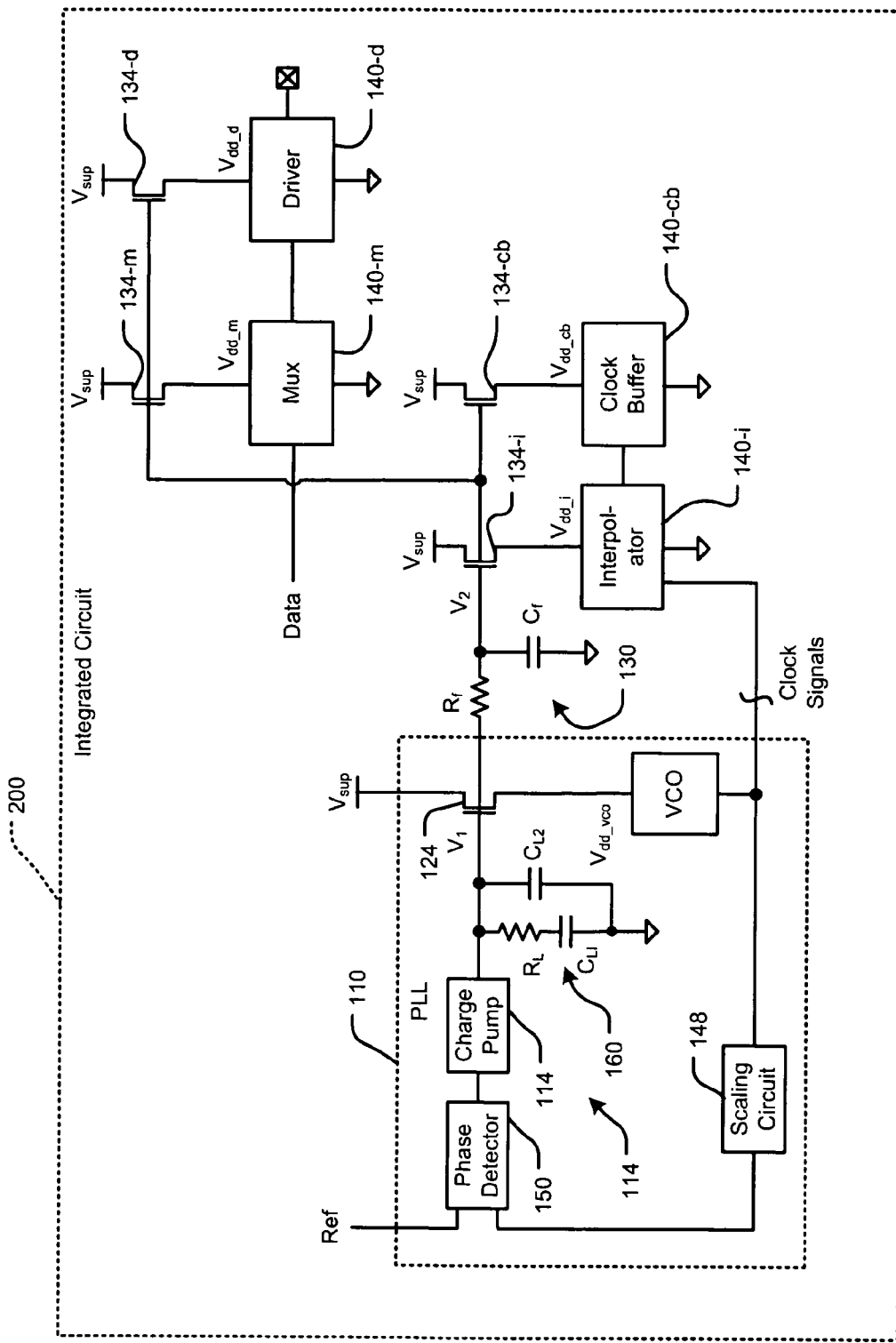
FIG. 5 is a functional block diagram and electrical schematic of still another implementation of an integrated circuit architecture according to the present invention including a phase lock loop and one or more analog circuits.

Referring now to FIG. 5, in a third integrated circuit 200, the loop filter 160 includes a resistance $R_L$ in series with a first capacitance $C_{L1}$ and a second capacitance $C_{L2}$ in series with the resistance $R_L$ and the first capacitance $C_{L1}$. While specific analog circuits are shown in this embodiment, skilled artisans will appreciate that the present invention has a broader application. The analog circuits 140 include an interpolator 140-i, a clock buffer 140-cb, a multiplexer 140-m and a driver 140-d, which are supplied by transistors 134-i, 134-cb, 134-m and 134-d, respectively, as described above. The transistors 134-i, 134-cb, 134-m and 134-d may have widths W that are equal and/or different as needed.

In one embodiment, the transistors 124 and 134 are MOSFET transistors. For example, the transistors are NMOS transistors and the control terminals are gates, the first terminals are drains and the second terminals are sources. Skilled artisans will appreciate that other transistor technologies may be used without departing from the present invention.

As can be appreciated by skilled artisans, the techniques described above can be applied to other circuits. For example and referring now to FIGS. 6A, 6B and 6C, an integrated circuit 230 includes a temperature-process tracking circuit 232 that has an output that is connected through the optional filter 130 to the control terminal of the transistor 134-1.

The second terminal of the transistor 134-1 biases the analog circuit 140-1. The control terminal of the transistor 134-1 is connected to control terminals of other transistors 134-2, . . . 134-N that are associated with other analog circuits 140-2, . . . , 140-N (collectively analog circuits 140), respectively, in the integrated circuit 100. Second terminals of the transistors 134-1, 134-2, and 134-3 bias the analog circuits 140-1, 140-2, and 140-3, respectively.

Figure 6B:
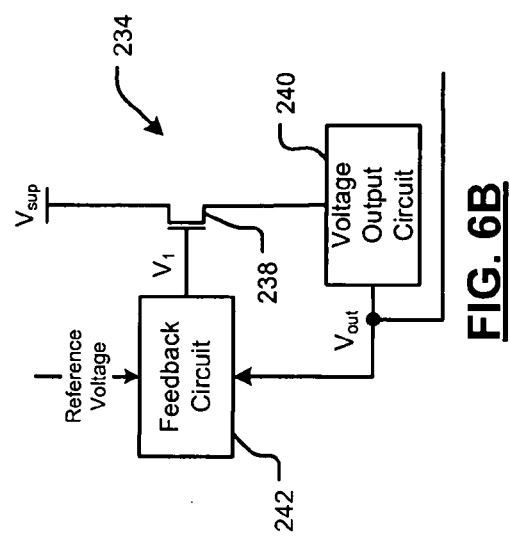
FIG. 6B is a functional block diagram of a voltage locking loop.

Referring now to FIG. 6B, in one implementation the temperature-process tracking circuit 232 comprises a voltage locking loop 234 that includes a master transistor 238, a voltage output circuit 240 and a feedback circuit 242. A reference voltage source (which can be on-chip or off-chip) generates a reference voltage signal $V_{ref}$. The voltage output circuit 240 generates an output voltage signal $V_{out}$ that is output to the feedback circuit 242 and/or to one or more of the analog circuits 134. The feedback circuit 242 compares the output voltage signal $V_{out}$ to the reference voltage signal $V_{ref}$ and generates a drive signal for the control terminal of the master transistor 238. The drive signal is also used to drive the slave transistors 134. As described above, scaling of the bias voltages can be performed for the analog circuits by adjusting the widths of the respective slave transistors.

Figure 6C:
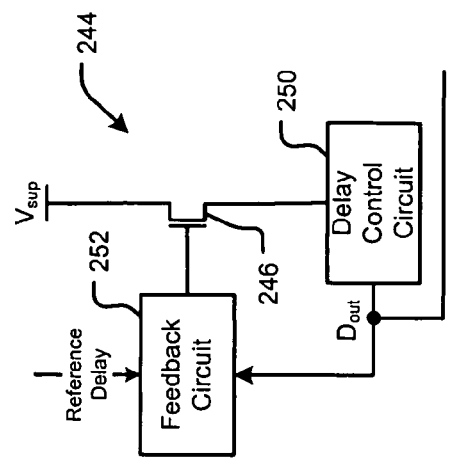
FIG. 6C is a functional block diagram of a delay locking loop.
Figure 6A:
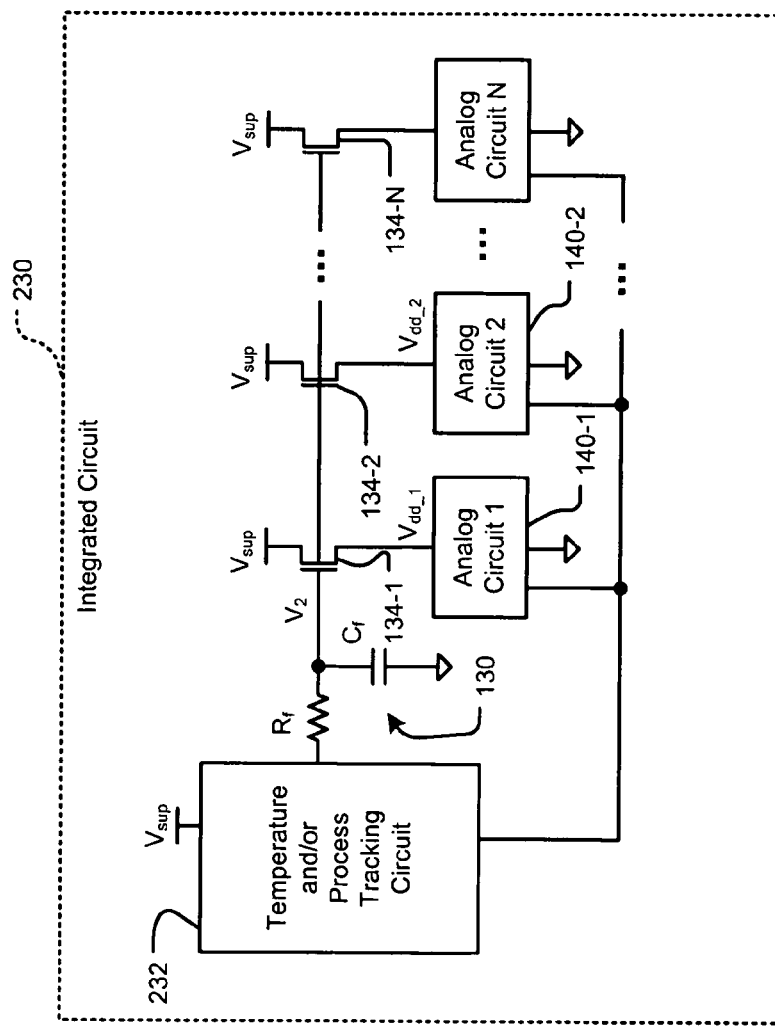
FIG. 6A is a functional block diagram and electrical schematic of an integrated circuit architecture including a temperature-process tracking circuit and one or more analog circuits.

Referring now to FIG. 6C, in another implementation the temperature-process tracking circuit 232 comprises a delay locking loop 238 that includes a master transistor 246, a delay control circuit 240 and a feedback circuit 242. A reference voltage source (which can be on chip or off chip) generates a reference delay signal $D_{ref}$. The voltage control circuit 240 generates an output delay signal $D_{out}$ that is output to the feedback circuit 242 and/or to one or more of the analog circuits 140. The feedback circuit 242 compares the output delay signal $D_{out}$ to the reference delay signal $D_{ref}$ and generates a drive signal for the control terminal of the master transistor 246. The drive signal is also used to drive the slave transistors 134. As described above, scaling of the bias voltages can be performed for the analog circuits by adjusting the widths of the respective slave transistors.

The integrated circuit architectures according to the present invention allow the same analog circuits to be used with different fabrication processes without requiring costly redesign. As a result, the design costs that are associated with the analog circuits can be leveraged over multiple integrated circuits that are fabricated using several different processes and the overall cost of the series of integrated circuits can be lowered. This approach also reduces design time when transferring from one process to another. While the integrated circuits that are described above include analog circuits, the integrated circuits may be mixed mode and include digital circuits as well.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An integrated circuit architecture, comprising:
    a phase lock loop (PLL) circuit that includes:
        a feedback circuit that receives a reference signal;
        a voltage controlled oscillator (VCO) that generates an output signal to an input of said feedback circuit; and
        a master transistor having a control terminal, a first terminal, and a second terminal that communicates with said VCO, wherein said feedback circuit compares said output signal of said VCO to said reference signal and outputs a drive signal to said control terminal of said master transistor based on said comparison;
    N circuits; and
    N slave transistors having control terminals that communicate with said control terminal of said master transistor, first terminals, and second terminals that communicate with respective ones of said N circuits.

2. The integrated circuit architecture of claim 1 further comprising a voltage supply, wherein said first terminals of said master transistor and said N slave transistors communicate with said voltage supply.

3. The integrated circuit architecture of claim 1 wherein said feedback circuit includes a phase detector that detects a phase difference between said reference signal and said output of said VCO and that generates an error signal based on said difference.

4. The integrated circuit architecture of claim 3 wherein said feedback circuit includes a charge pump that receives said error signal from said phase detector.

5. The integrated circuit architecture of claim 4 wherein said feedback circuit includes a loop filter having an input that communicates with said charge pump and an output that generates said drive signal.

6. The integrated circuit architecture of claim 1 wherein at least one of said N circuits is one of an interpolator, a multiplexer, a clock buffer and a driver.

7. The integrated circuit architecture of claim 6 wherein said interpolator receives a clock output of said VCO.

8. The integrated circuit architecture of claim 1 further comprising a scaling circuit that has an input that communicates with said VCO and an output that communicates with said feedback circuit and that at least one of divides said output signal of said VCO by a first integer and multiplies said output signal of said VCO by a second integer.

9. The integrated circuit architecture of claim 1 wherein said master transistor and said N slave transistors are NMOS transistors, said first terminals are drains, said second terminals are sources, and said control terminals are gates.

10. The integrated circuit architecture of claim 1 wherein N is equal to 1.

11. The integrated circuit architecture of claim 1 wherein N is greater than 1.

12. The integrated circuit architecture of claim 1 further comprising a filter network that communicates with said control terminal of said master terminal and said control terminals of said N slave transistors.

13. An integrated circuit architecture, comprising:
    phase lock loop (PLL) means for locking onto a reference phase and that includes:
        feedback means for receiving said reference signal;
        voltage controlled oscillator (VCO) means for generating an output signal having a second phase, wherein said feedback means receives said output signal; and
        a master transistor having a control terminal, a first terminal, and a second terminal that communicates with said VCO means, wherein said feedback means compares said output signal of said VCO means to said reference frequency and outputs a drive signal to said control terminal of said master transistor based on said comparison;
    N circuits; and
    N slave transistors having control terminals that communicate with said control terminal of said master transistor, first terminals, and second terminals that communicate with respective ones of said N circuits.

14. The integrated circuit architecture of claim 13 further comprising voltage supply means for generating a supply voltage for said first terminals of said master transistor and said N slave transistors.

15. The integrated circuit architecture of claim 13 wherein said feedback means includes phase detecting means for detecting a phase difference between said reference signal and said output signal of said VCO means and that generates an error signal based on said difference.

16. The integrated circuit architecture of claim 15 wherein said feedback means includes charge pump means for receiving said error signal from said phase detector.

17. The integrated circuit architecture of claim 15 wherein said feedback means includes loop filter means for filtering and having an input that communicates with said charge pump means and an output that generates said drive signal.

18. The integrated circuit architecture of claim 13 wherein at least one of said N circuits is one of an interpolator, a multiplexer, a clock buffer and a driver.

19. The integrated circuit architecture of claim 18 wherein said interpolator receives a clock output of said VCO means.

20. The integrated circuit architecture of claim 13 further comprising scaling means that has an input that communicates with said VCO means and an output that communicates with said feedback means and for at least one of dividing said output signal of said VCO means by a first integer and multiplying said output signal of said VCO means by a second integer.

21. The integrated circuit architecture of claim 13 wherein said master transistor and said N slave transistors are NMOS transistors, said first terminals are drains, said second terminals are sources, and said control terminals are gates.

22. The integrated circuit architecture of claim 13 wherein N is equal to 1.

23. The integrated circuit architecture of claim 13 wherein N is greater than 1.

24. The integrated circuit architecture of claim 13 further comprising a filter network means for filtering and that communicates with said control terminal of said master terminal and said control terminals of said N slave transistors.

25. A method for controlling a bias voltage of N circuits in an integrated circuit, comprising:
    receiving a reference signal having a first phase;
    generating a second signal having a second phase using a voltage controlled oscillator (VCO);
    comparing said first phase to said second phase and generating a drive signal based on said comparison;
    outputting said drive signal to a control terminal of a master transistor;
    coupling a second terminal of said master transistor to said VCO;
    coupling control terminals of N slave transistors to said control terminal of said master transistor; and
    coupling second terminals of said N slave transistors to respective ones of said N circuits.

26. The method of claim 25 wherein N is equal to 1.

27. The method of claim 25 wherein N is greater than 1.

28. The method of claim 25 further comprising filtering said drive signal before said control terminals of said N slave transistors.

* * * * *